United States Patent
McGrath et al.

(10) Patent No.: US 7,566,923 B2
(45) Date of Patent: Jul. 28, 2009

(54) ISOLATED POWER DOMAIN CORE REGIONS IN PLATFORM ASICS

(75) Inventors: Donald T. McGrath, Fort Collins, CO (US); Gregory Winn, Fort Collins, CO (US); Scott C. Savage, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 107 days.

(21) Appl. No.: 11/318,332

(22) Filed: Dec. 23, 2005

(65) Prior Publication Data

US 2007/0145413 A1   Jun. 28, 2007

(51) Int. Cl.
*H01L 27/118* (2006.01)
(52) U.S. Cl. .................. 257/204; 257/E27.11; 438/128
(58) Field of Classification Search ............... 257/202, 257/207, E27.11, E27.108; 438/128; 326/38; 716/4, 10–12, 17; 380/211
See application file for complete search history.

(56) References Cited

U.S. PATENT DOCUMENTS

2003/0178648 A1* 9/2003 Bansal ....................... 257/202
2005/0236673 A1* 10/2005 Woo et al. ................... 257/355

* cited by examiner

*Primary Examiner*—Thanh V Pham
*Assistant Examiner*—Jami M Valentine
(74) *Attorney, Agent, or Firm*—Christopher P. Maiorana, PC

(57) ABSTRACT

A platform application specific integrated circuit (ASIC) including a base layer. The base layer generally comprises a predefined input/output (I/O) region and a predefined core region. The predefined input/output (I/O) region may comprise a plurality of pre-diffused regions disposed in the platform ASIC. The predefined core region may comprise one or more metal layers defining a plurality of power regions formed according to a custom design created after the base layer is fabricated. The base layer can be customized by depositing one or more metal layers.

16 Claims, 2 Drawing Sheets

ISOLATED POWER DOMAIN CORE REGIONS IN PLATFORM ASICS

FIELD OF THE INVENTION

The present invention relates to platform application specific integrated circuit (platform ASIC) design generally and, more particularly, to a method and/or architecture for implementing isolated power domain core regions in platform ASICs.

BACKGROUND OF THE INVENTION

An integrated circuit (IC) design can include support for mixed-signal functions, noise sensitive circuitry, and battery applications. The term mixed-signal refers to functions involving both digital and analog signals. Existing platform (or structured) application specific integrated circuits (platform ASICs) use a common supply (single power domain) to power the entire core region. Using a common supply to power the entire core region can waste power, reduce battery life and degrade performance of noise sensitive circuitry.

It would be desirable to have an architecture and/or method for isolated power domain core regions in platform ASICs.

SUMMARY OF THE INVENTION

The present invention concerns a platform application specific integrated circuit (ASIC) including a base layer. The base layer generally comprises a predefined input/output (I/O) region and a predefined core region. The predefined input/output (I/O) region may comprise a plurality of pre-diffused regions disposed in the platform ASIC. The pre-defined core region may comprise one or more metal layers defining a plurality of power regions formed according to a custom design created after the base layer is fabricated. The base layer can be customized by depositing one or more metal layers.

The objects, features and advantages of the present invention include providing a method and/or architecture for isolated power domain core regions in platform ASICs that may (i) be formed using a metal mask set, (ii) allow a customer to form a number of isolated power regions in a core region of a platform ASIC, (iii) allow noise sensitive circuitry to have separate (isolated) supply and ground, (iv) allow regions to be powered up only when connected to wall outlet, (v) allow battery applications to power up only regions critical to an application at any one time (vi) allow for power supply over-driving regions of circuitry to increase voltage headroom and/or improve performance, (vii) allow for power supply under-driving regions of circuitry to reduce power consumption in regions where a lower voltage supply will not impair functionality, (viii) allow for back-biasing the silicon substrate to alter the threshold voltage of devices to reduce static power and/or to alter performance of transistors and/or (ix) avoid large leakage currents that drain batteries prematurely.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
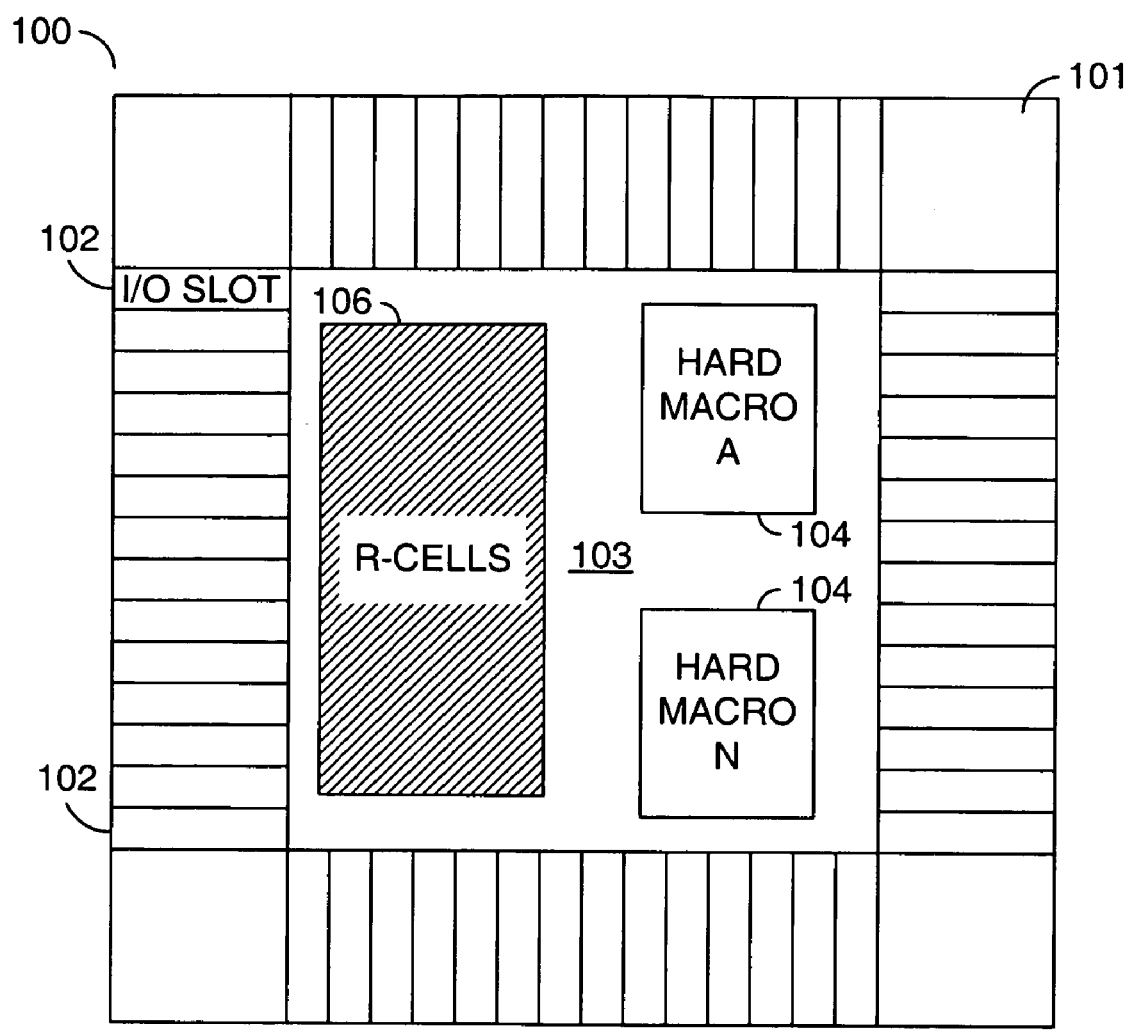
FIG. 1 is a block diagram illustrating a platform application specific integrated circuit (ASIC) in accordance with one or more preferred embodiments of the present invention.

Referring to FIG. 1, a block diagram of a programmable platform device (or die, or chip, or slice) 100 is shown in accordance with one or more preferred embodiments of the present invention. The slice 100 may be implemented, in one example, as a partially manufactured semiconductor device (e.g., a platform or structured application specific integrated circuit (platform ASIC)) in which all of the non-metal silicon layers (or base layers) have been fabricated (e.g., during a first processing, manufacturing or pre-inventory phase), but where customization of the slice 100 may be performed later (e.g., during a second processing, manufacturing or completion phase) via one or more upper metal layers. In general, the first manufacturing phase may configure the device 100 as a configurable platform capable of being customized for any of a plurality of applications. The second manufacturing phase may customize the device 100 for a specific application defined by an end-user. For example, customization may be accomplished by changing one or more metal layers used to interconnect structures in the base layer.

In one example, a number of devices (or slices) 100 may be fabricated having different varieties and/or numbers of intellectual property (IP) blocks, diffused memories, etc. By fabricating a variety of slices with a variety of IP blocks and diffused memories, a wide variety of applications may be supported. For example, a particular slice 100 may be selected for customization at a later time because the particular IP blocks implemented are suitable for a customized application. By deferring customization of the slice 100, a manufacturer may have flexibility to keep an inventory of mostly complete slices 100 that may be customized for a variety of applications. The IP blocks may comprise, for example, hard IP, soft IP and/or firm IP. Hard IP may be diffused at optimal locations within a slice using cell-based elements for maximum performance and density (e.g., embedded processors, transceivers, etc.). Soft IP may be incorporated into a slice as a function block. Soft IP may be implemented similarly to other blocks in a design (e.g., with specific timing criteria to ensure functionality). Soft IP may be implemented, in one example, as Register Transfer Language (RTL) code. Firm IP generally allows fully routed and characterized high-performance blocks to be implemented in a slice design.

A physical layout of the slice 100 generally comprises a first region 101 that may be defined around a periphery (or outer edge) of the slice 100. The region 101 may be referred to as an input/output (I/O) region. The region 101 may comprise a plurality of input/output (I/O) circuits (or slots) 102. The physical layout of the slice 100 may further comprise a second region 103 that may be located inside the first region 101. The region 103 may be referred to as a core region. The region 103 may contain standard library and/or custom circuitry that makes the slice 100 unique.

The slice 100 may comprise a number of pre-diffused regions. In one example, the slice 100 may comprise the plurality of regions 102, a number of regions 104, and one or more regions 106. The regions 102 may be implemented as configurable I/O slots (or ConfigIOs). For example, each of the regions 102 may be configured to couple the core region 103 of the slice 100 to an I/O pin. The regions 104 may be implemented as one or more hard IP blocks (or hardmacros). The regions 106 may be implemented as one or more customizable regions. In one example, the customizable regions 106 may comprise a programmable transistor fabric (e.g., a plurality of R-cells). In another example, the diffused regions 106 may be implemented as a gate array region. The plurality of regions 102 may be distributed around the periphery (or edge) of the slice 100. The regions 104 and 106 may be distributed within the core region 103 of the slice 100.

In one example, the regions 104 may be implemented similarly to an ASIC design. In general, the regions 104 may be configured to provide a number of functions on (or in) the slice 100. For example, the regions 104 may comprise phase locked loop (PLL) blocks (or modules), instances of processor blocks (or modules), input/output physical level (PHY) macro blocks (or modules), and/or any other type of IP block (or module) appropriate to meeting the design criteria of a particular implementation. Soft IP blocks (or modules) and firm IP blocks (or modules) may be implemented in the customizable region(s) 106.

The region 106 may be customized (e.g., by application of one or more metal layers), in one example, as logic and/or memory. In one example, the region 106 may be implemented as a sea of gates (or gate array). In another example, the region 106 may be implemented as a configurable transistor fabric comprising a number of R-cells. The term R-cell generally refers to an area of silicon designed (or diffused) to contain multiple transistors that have not yet been personalized (or configured) with metal layers. Wire (or trace) layers may be added for interconnecting the R-cells to make particular transistors, logic gates, soft and firm IP blocks and/or storage elements. For example, the R-cells in the region 106 may be customized to build non-diffused memories or other circuits for a particular application. A region 106 filled with thousands of R-cells may be referred to as an R-cell transistor fabric.

An R-cell generally comprises multiple diffusions, a gate layer and a metal layer for forming the parts of N-type and/or P-type transistors, and the contact points where upper metal (or wire) layers may be attached in subsequent manufacturing steps (e.g., to power, ground, inputs and outputs). For example, each R-cell may be implemented as a five-transistor cell, which includes two n-channel metal oxide semiconductor field effect transistors (NMOS devices), two p-channel MOS field effect transistors (PMOS devices) and one small PMOS device. In general, the R-cells may be, in one example, building blocks for logic, mixed-signal and/or storage elements. The R-cells may be diffused in a regular pattern throughout the slice 100. For example, one way of designing a chip that performs logic and storage functions may be to place numerous R-cells row after row, column after column. A large area of the chip may be devoted to nothing but R-cells. The R-cells may be personalized (or configured) in subsequent production steps (e.g., by depositing and patterning metal layers) to provide particular logic and mixed-signal functions. The logic and mixed-signal functions may be further wired together (e.g., a gate array design).

Prior to customization, the regions 102 may comprise generic pre-diffused regions that may provide a rich set of devices (e.g., transistors, resistors, capacitors, etc.). A number of different generic pre-diffused regions may be implemented. In one example, a number of types of transistors (e.g., NMOS and PMOS transistors with different oxide thickness, etc.) may be implemented in each of the regions 102. However, it will be understood by those skilled in the art that other types and/or numbers of devices may be implemented without departing from the scope of the present invention.

Prior to customization, the region 103 may comprise generic elements for implementing a plurality of electrically isolated power regions. In one example, a number of separate power regions may be implemented. The separate power regions may be linked (or connected, or coupled, etc.) during customization to form electrically isolated power regions to meet customer specifications. In another example, the region 103 may comprise a power mesh configured to be easily broken up during customization to form a number of electrically isolated power regions that meet the customers specification. Isolated power domains may be implemented in the core region 103 for pre-defused cells (e.g., PLLs and SERDES). Power may be routed in upper level metal layers and may be customized with separate power mesh regions for low noise, low jitter regions. Power and ground I/Os may exist in the I/O region associated with the isolated power domains in the core region.

Figure 2:
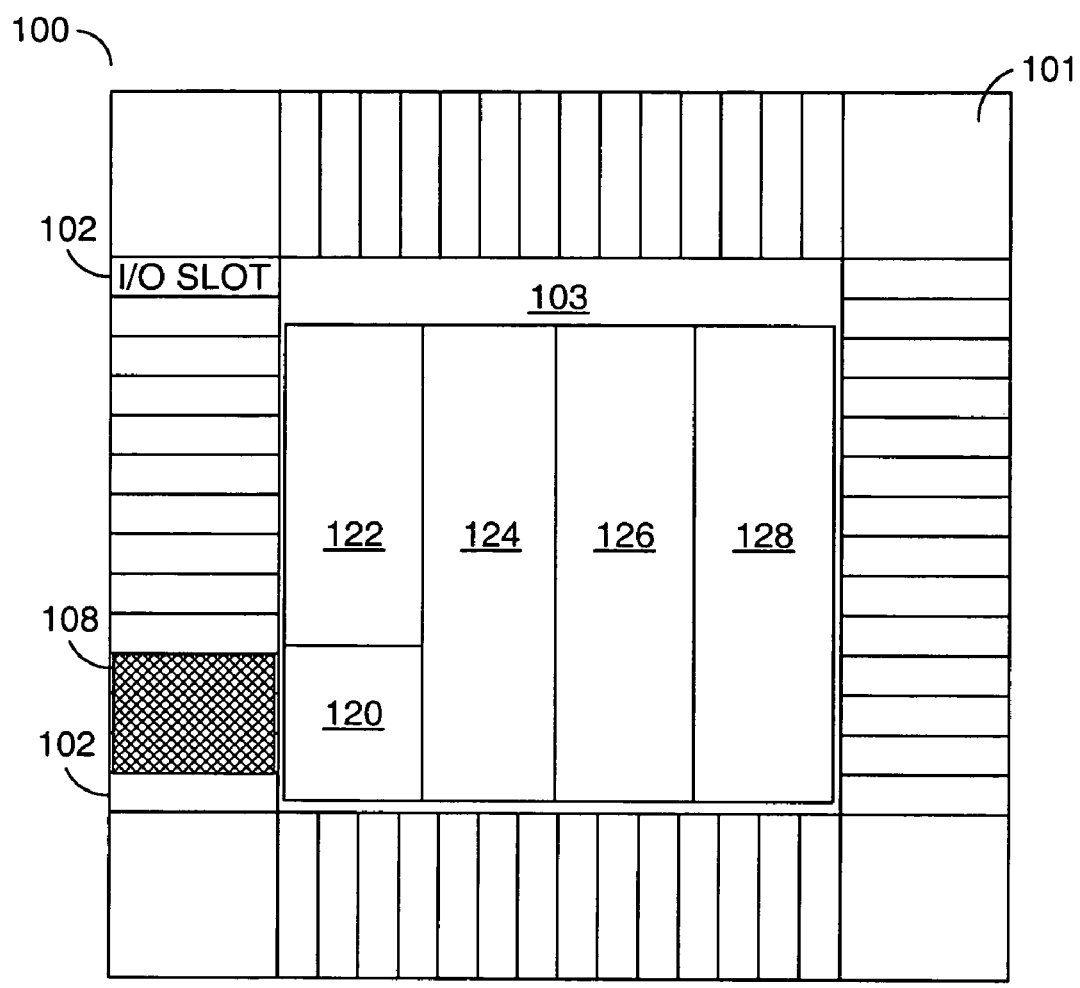
FIG. 2 is a block diagram illustrating a number of power regions implemented in a core region in accordance with a preferred embodiment of the present invention.

Referring to FIG. 2, a block diagram of the programmable platform device 100 is shown illustrating a number of power regions implemented in accordance with a preferred embodiment of the present invention. The regions 104 and 106 have been omitted for clarity. The present invention generally facilitates the creation of a number of isolated power regions on a platform (or structured) ASIC to aid in noise coupling, power management and battery life. In one example, the core may be divided into a number of isolated power regions. In one example, a portion of the core 103 may be combined with a portion 108 of the I/O region 101 to implement a low jitter PLL or DLL within a separate power region 120. A region 124 may be implemented that may be powered only when the system is using power from a wall outlet. Another region 126 may be implemented that may be always powered (e.g., either from the wall outlet or a battery). Still another power region 128 may be configured to save battery power. For example, the region 128 may be powered only part time when operating with battery power, while other power regions are powered down. The multiple regions in the core region 103 may be further configured to minimize noise coupling in sensitive circuits (e.g., PLL, DLL, etc.).

The present invention may allow users to implement various power schemes for different regions of the core, as part of a power management plan. The present invention may also increase battery life by allowing users to power regions with batteries only when necessary. The present invention may provide power and ground isolation for low noise circuitry and low jitter clocking circuits. The present invention allows for multiple supply voltages for different regions and circuits. Different supply voltages may be specified for different regions and circuits where the supply is used as a signal. The present invention may allow for power supply over-driving regions of circuitry to increase voltage headroom and/or improve performance. The present invention may allow for power supply under-driving regions of circuitry to reduce power consumption in regions where a lower voltage supply will not impair functionality. The present invention may allow for back-biasing the silicon substrate to alter the threshold voltage of devices to reduce static power and/or to alter performance of transistors In one example, the present invention may facilitate the user defining metal layers for laying out power distribution in the core region. In another example, a programmable power mesh may be implemented and the user may customize the power mesh by adding or removing links. Multiple power zones may be created by the user by performing custom layout of the metal power grid, or by using a more structured approach. For example, tiles of a grid may be formed that may be connected together in various arrangements. The different metal layers may be used for different power regions provided supply voltage drop may be managed.

While the invention has been particularly shown and described with reference to the preferred embodiments thereof, it will be understood by those skilled in the art that various changes in form and details may be made without departing from the spirit and scope of the invention.

The invention claimed is:

1. A platform application specific integrated circuit (ASIC) having a base layer comprising:
   a predefined input/output (I/O) region comprising a plurality of first pre-diffused regions disposed in said base layer;
   a predefined core region comprising (i) a plurality of second pre-diffused regions disposed in said base layer and (ii) one or more metal layers defining a plurality of power regions, wherein said plurality of power regions are electrically isolated from each other and said one or more metal layers on said base layer are deposited such that each of said plurality of power regions is connected to a respective one of a plurality of supply voltages; and
   an R-cell transistor fabric, said R-cell transistor fabric comprising a plurality of R-cells, each R-cell including multiple diffusions, a gate layer and a metal layer forming a five-transistor cell, said five-transistor cell including two n-channel metal oxide semiconductor (NMOS) field effect transistors (FETs), two p-channel metal oxide semiconductor (PMOS) FETs, one small PMOS device, and contact points, wherein said contact points are attached to power, ground, inputs and outputs via upper metal layers.

2. A platform application specific integrated circuit (ASIC) having a base layer comprising:
   a predefined input/output (I/O) region comprising a plurality of first pre-diffused regions disposed in said base layer;
   a predefined core region comprising a plurality of second pre-diffused regions disposed in said base layer and one or more metal layers defining a plurality of power regions, wherein said plurality of power regions are electrically isolated from each other and said one or more metal layers on said base layer are deposited such that each of said plurality of power regions is connected to a respective one of a plurality of supply voltages; and
   a plurality of customizable cells, each customizable cell including multiple diffusions, a gate layer and a metal layer forming a five-transistor cell, said five-transistor cell including two n-channel transistors, two p-channel transistors, one small p-channel device, and contact points, wherein said contact points are attached to power, ground, inputs and outputs via upper metal layers.

3. The platform ASIC according to claim 2, wherein said one or more metal layers customize said pre-diffused regions of said platform ASIC as a function block in an isolated power domain.

4. The platform ASIC according to claim 3, wherein said one or more metal layers customize said pre-diffused regions of said platform ASIC as a function block selected from the group consisting of (i) a low jitter phase locked loop (PLL) and (ii) a low jitter delay lock loop (DLL).

5. The platform ASIC according to claim 2, wherein at least one of said plurality of power regions is powered only part time when said platform ASIC is operating with battery power.

6. The platform ASIC according to claim 2, wherein at least one of said plurality of power regions is powered down when said platform ASIC is operating with battery power.

7. The platform ASIC according to claim 2, wherein at least one of said plurality of power regions is configured to operate only when power is available from a source other than a battery.

8. The platform ASIC according to claim 2, wherein said plurality of power regions in said core region are associated with power and ground I/Os implemented in said I/O region.

9. The platform ASIC according to claim 2, wherein said platform ASIC comprises a plurality of power grid tiles connected to form said plurality of power regions.

10. The platform ASIC according to claim 2, wherein one or more of said plurality of power regions are configured for power supply over-driving of circuitry.

11. The platform ASIC according to claim 10, wherein one or both of voltage headroom and performance of said one or more of said plurality of power regions are responsive to said power supply over-driving.

12. The platform ASIC according to claim 10, wherein a power consumption of circuitry in one or more of said plurality of power regions is responsive to power supply under-driving of said circuitry.

13. The platform ASIC according to claim 10, wherein one or more of said plurality of power regions are configured for back-biasing a silicon substrate of said platform ASIC.

14. The platform ASIC according to claim 13, wherein one or more of (i) a threshold voltage of a device, (ii) a static power consumption of a region and (iii) a performance characteristic of one or more transistors is determined in response to said back-biasing of said silicon substrate of said platform ASIC.

15. The platform ASIC according to claim 2, wherein at least two of said plurality of power regions are configured to operate at different voltages.

16. The platform ASIC according to claim 2, wherein:
   at least one of said plurality of power regions is configured to operate with battery power;
   at least one of said plurality of power regions is powered down when operating with battery power; and
   at least one of said plurality of power regions is configured to operate only when power is available from a source other than battery power.

* * * * *